United States Patent
Wang et al.

(10) Patent No.: US 10,249,361 B2
(45) Date of Patent: Apr. 2, 2019

(54) SRAM WRITE DRIVER WITH IMPROVED DRIVE STRENGTH

(71) Applicant: NVIDIA CORPORATION, Santa Clara, CA (US)

(72) Inventors: Eugene Wang, Shanghai (CN); Gavin Chen, Shanghai (CN); Demi Shen, Shanghai (CN)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 14/154,678

(22) Filed: Jan. 14, 2014

(65) Prior Publication Data

US 2015/0200006 A1 Jul. 16, 2015

(51) Int. Cl.
*G11C 11/419* (2006.01)

(52) U.S. Cl.
CPC .................. *G11C 11/419* (2013.01)

(58) Field of Classification Search
CPC .................................................. G11C 11/419
USPC ............. 365/154, 189.14, 189.16, 190, 206, 365/233.16, 189.011; 257/903
See application file for complete search history.

(56) References Cited

U.S. PATENT DOCUMENTS

| | | | | |
|---|---|---|---|---|
| 4,418,402 A * | 11/1983 | Heagerty | ............ | G11C 11/4125 327/208 |
| 5,267,192 A * | 11/1993 | Nogami | ................ | G11C 11/412 365/154 |
| 5,285,414 A * | 2/1994 | Yamauchi | ............. | G11C 11/419 365/189.11 |
| 5,583,816 A * | 12/1996 | McClure | ................ | G11C 29/34 365/201 |
| 5,793,670 A * | 8/1998 | Wada | ...................... | G11C 11/41 257/205 |
| 5,877,979 A * | 3/1999 | Li | .......................... | G11C 11/412 365/154 |
| 5,943,278 A * | 8/1999 | Su | .......................... | G11C 11/419 365/189.05 |
| 6,657,886 B1 * | 12/2003 | Adams | .................. | G11C 11/419 365/154 |
| 7,301,793 B2 * | 11/2007 | Kanehara | ............. | G11C 7/1051 365/154 |
| 7,684,230 B2 * | 3/2010 | Yamagami | ............ | G11C 11/413 365/154 |
| 7,898,896 B2 * | 3/2011 | Miyanishi | ............ | G11C 7/1006 365/154 |
| 2004/0057279 A1 * | 3/2004 | Clark | .................. | G06F 12/0893 365/164 |

(Continued)

*Primary Examiner* — Sung Cho
(74) *Attorney, Agent, or Firm* — Artegis Law Group, LLP

(57) ABSTRACT

A subsystem configured to write data to a static random access memory cell employs a single N-channel MOS device connected to ground in each leg of the bi-stable memory cell to overdrive the stored data. The subsystem implements the dual control required to effect matrix operation of the SRAM cell in the gate circuit of the single N-channel MOS device in the drive path. Specifically, the column select signal controls a semiconductor junction that interrupts the data connection to the gate. In this manner, the column select control is removed from the drive path, thus increasing drive strength. Further, a second semiconductor junction connects the gate of the single NMOS device in the drive path when the gate signal is interrupted.

23 Claims, 7 Drawing Sheets

(56) References Cited

U.S. PATENT DOCUMENTS

| | | | | |
|---|---|---|---|---|
| 2007/0025170 A1* | 2/2007 | Barth, Jr. | G11C 7/02 | |
| | | | 365/208 | |
| 2007/0139997 A1* | 6/2007 | Suzuki | G11C 5/14 | |
| | | | 365/154 | |
| 2008/0037337 A1* | 2/2008 | Suzuki | G11C 11/413 | |
| | | | 365/189.16 | |
| 2008/0151604 A1* | 6/2008 | Suzuki | G11C 11/412 | |
| | | | 365/154 | |
| 2009/0016144 A1* | 1/2009 | Masuo | G11C 11/412 | |
| | | | 365/230.06 | |
| 2009/0248387 A1* | 10/2009 | Singhee | G06F 17/5036 | |
| | | | 703/16 | |
| 2010/0157706 A1* | 6/2010 | Cho | G11C 7/12 | |
| | | | 365/203 | |
| 2011/0026309 A1* | 2/2011 | Kumar | G11O 5/145 | |
| | | | 365/154 | |
| 2011/0149662 A1* | 6/2011 | Batra | G11C 7/12 | |
| | | | 365/189.16 | |
| 2011/0267914 A1* | 11/2011 | Ishikura | G11C 7/06 | |
| | | | 365/208 | |
| 2011/0305073 A1* | 12/2011 | Hirabayashi | G11C 11/412 | |
| | | | 365/156 | |
| 2013/0258760 A1* | 10/2013 | Hold | G11C 11/412 | |
| | | | 365/154 | |
| 2014/0169076 A1* | 6/2014 | Behrends | G11C 7/12 | |
| | | | 365/154 | |
| 2015/0109852 A1* | 4/2015 | Yang | G11C 8/16 | |
| | | | 365/154 | |
| 2016/0012881 A1* | 1/2016 | Kuo | G11C 11/419 | |
| | | | 365/156 | |

* cited by examiner

SRAM WRITE DRIVER WITH IMPROVED DRIVE STRENGTH

BACKGROUND OF THE INVENTION

Field of the Invention

Embodiments of the present invention relate generally to memory architecture and, more specifically, to an approach to improving drive strength in a static random access memory write driver.

Description of the Related Art

In computer systems, generally, and in graphics processing units (GPUs), in particular, there is widespread utilization of static random access memory (SRAM) circuits. A conventional SRAM cell consists of two inverters connected front to back and two pass transistors connected with output of inverters and bit line respectively. Specifically, the output of the first inverter is connected to the input of the second inverter, and the output of the second inverter is connected to the input of the first inverter. The drain or source terminals of one pass transistor is connected with the output of the first inverter or bit line, and the drain and source terminals of another pass transistor are connected with the output of the second inverter and the complementary bit line. The gate terminals of both two gate pass transistors are connected to the word line. The output of one inverter represents the data bit, while the output of the complementary inverter represents the inverse of the data bit. To change the logic state (i.e. write a new value to the SRAM cell), a memory driver circuit overdrives one of the outputs to the opposite state. The overdrive action causes the driven inverter to change state, and the complementary inverter subsequently changes state to achieve the opposite logic state of both inverters In conventional systems, the output of the inverter that is at the high level is driven to the low level. Each inverter includes a pair of field effect transistors (FETs). One P-channel FET (PFET) is connected to a supply voltage, and one N-channel FET (NFET) is connected to ground. The midpoints of both FETs are connected together. This arrangement is termed a complementary-metal-oxide-semiconductor (CMOS) circuit. In order to drive the output of the inverter to ground, the memory driver overpowers the PFET of the CMOS pair that forms the inverter. Therefore, the write driver that overdrives the inverter must be strong enough to pull the high level output below the threshold of the driven inverter, even though the P-channel device is trying to pull the output up. The strength, or current sinking capacity, of an integrated FET is proportional to the channel width of the device. Hence, N-channel FETs with the capability to overdrive an integrated P-channel device must have proportionally larger area.

Conventional SRAM memory cell macros are typically arranged in a matrix array. The data inputs to the SRAM cells, termed bit lines, are connected to all cells in a column. The row controls, termed word lines, are connected to all the cells in a row to select a particular row of cells in which data is stored. The circuit topology to realize the column selection and data writing of an SRAM cell consists of a pair of N-channel FETs connected in series that provide the conductive path between the pass transistor in memory cell and system ground. Thus, in a conventional SRAM driver arrangement, two NFETs in series form the path to ground that overdrives the upper PFET in the SRAM cell.

As described above, the area of the driving NFET must be proportionally larger than the upper PFET. Configuring two NFETS in series, then, further increases the area of the driver for times in order to achieve the same drive strength. Moreover, the series arrangement imposes a restriction on the minimum level of the supply voltage, as the serial structure reduces the driving strength, which reduces the write noise margin. The reduced write noise margin, in turn, limits the minimum supply voltage level. System voltage levels in present technology are decreasing to achieve increased speed and reduced power consumption. As systems migrate to lower supply voltage levels, the write noise margin of the SRAM is further reduced.

One drawback to the above approach is that the two series N-channel devices that overdrive the upper P-channel devices provide a weak drive that further weakens at reduced supply voltage levels. Further, tradeoffs to meet design margins that afford reliable operation essentially entail a choice between increasing die area excessively and imposing restrictions on the SRAM supply voltage reduction, thus limiting the scope of improvement in speed and power efficiency as technology advances.

As the foregoing illustrates, what is needed in the art is an approach to a drive circuit that improves the strength of an SRAM write driver while maintaining effective operation at reduced supply voltage levels.

SUMMARY OF THE INVENTION

One embodiment of the present invention sets forth a subsystem configured to perform write operations with memory cells, including a first bit line driver configured to write a data bit to a memory cell and including a first circuit element that is gated by a first write select line and coupled to a first data line configured to transport the data bit, a second circuit element coupled to the first circuit element and gated by the first write select line, and a third circuit element that is coupled to the memory cell and gated by the first circuit element and the second circuit element and is configured to output the data bit to the memory cell upon activation of the first data line and the first write select line.

One advantage of the disclosed approach is that a single circuit element overdrives the memory cell, thus, increasing the write noise margin and reducing the area of the driver circuit. Further, the increased drive margin permits operation at reduced supply voltage, thus supporting the trend to low voltage memory cells in the present technology.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
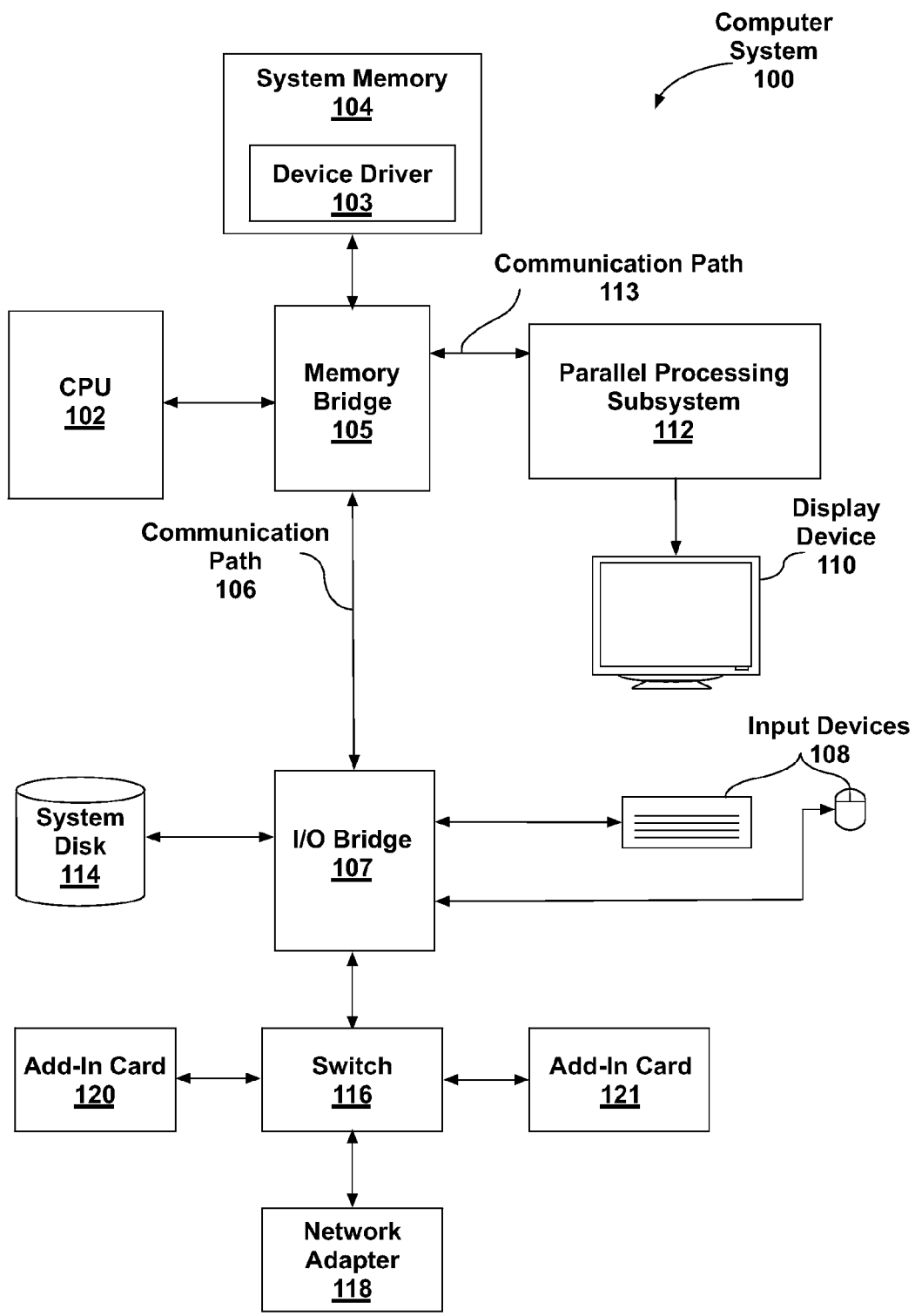
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
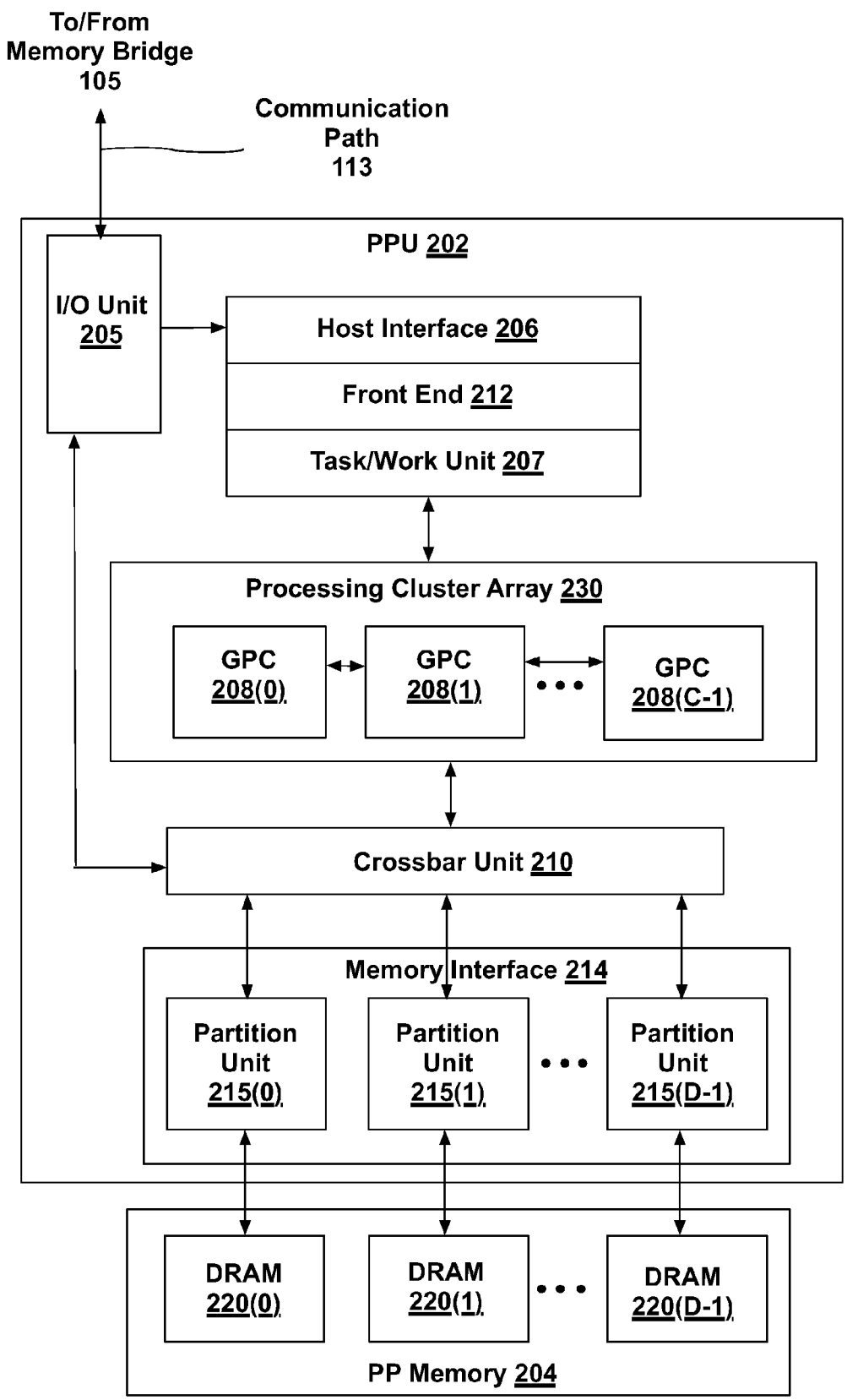
FIG. 2 is a block diagram of a parallel processing unit included in the parallel processing subsystem of FIG. 1, according to one embodiment of the present invention.

FIG. 2 is a block diagram of a parallel processing unit (PPU) 202 included in the parallel processing subsystem 112 of FIG. 1, according to one embodiment of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where $C \geq 1$. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where $D \geq 1$. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3:
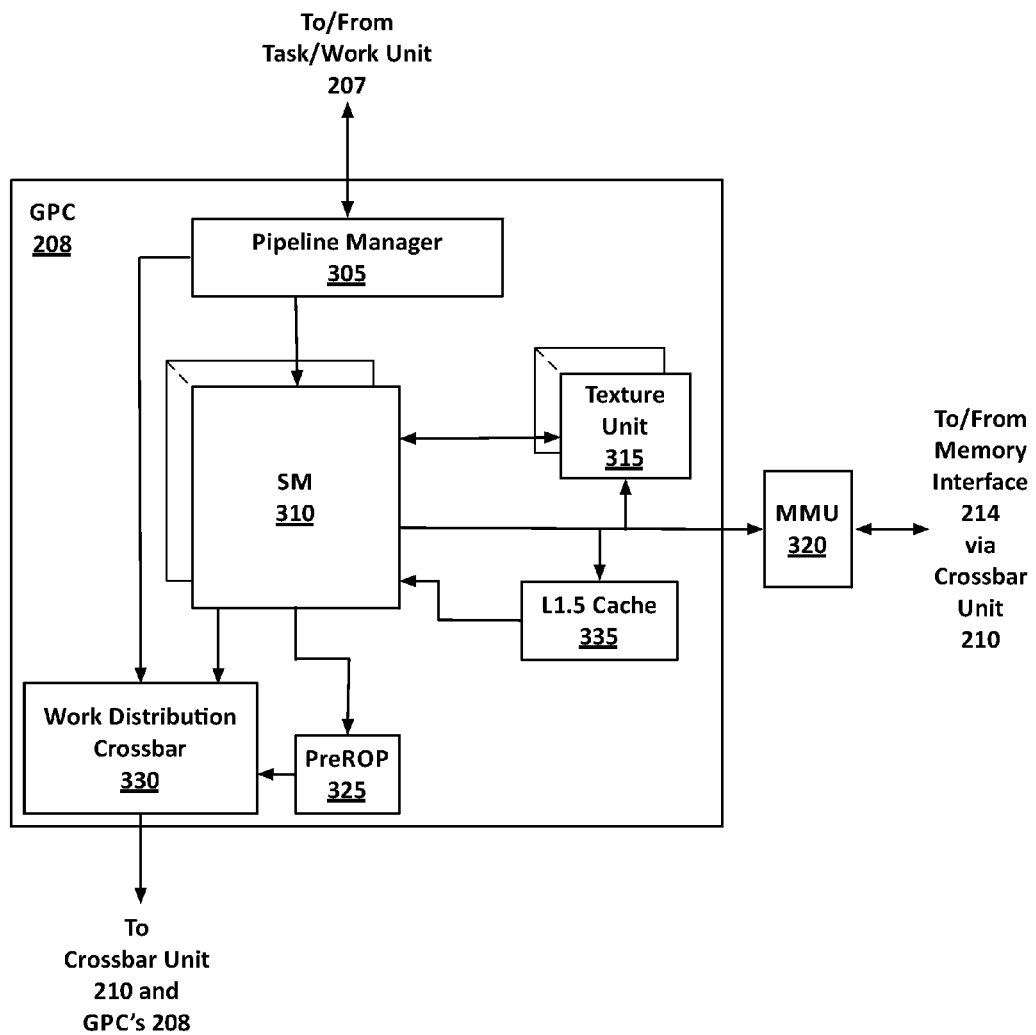
FIG. 3 is a block diagram of a general processing cluster included in the parallel processing unit of FIG. 2, according to one embodiment of the present invention.

FIG. 3 is a block diagram of a GPC 208 included in PPU 202 of FIG. 2, according to one embodiment of the present invention. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3, each SM 310 contains a level one (L1) cache or uses space in a corresponding L1 cache outside of the SM 310 to support, among other things, load and store operations performed by the execution units. Each SM 310 also has access to level two (L2) caches (not shown) that are shared among all GPCs 208 in PPU 202. The L2 caches may be used to transfer data between threads. Finally, SMs 310 also have access to off-chip "global" memory, which may include PP memory 204 and/or system memory 104. It is to be understood that any memory external to PPU 202 may be used as global memory. Additionally, as shown in FIG. 3, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in an L2 cache (not shown), parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processing units, such as SMs 310, texture units 315, or preROP units 325, may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-3 in no way limits the scope of the present invention.

SRAM Write Driver with Improved Drive Strength

Figure 4:
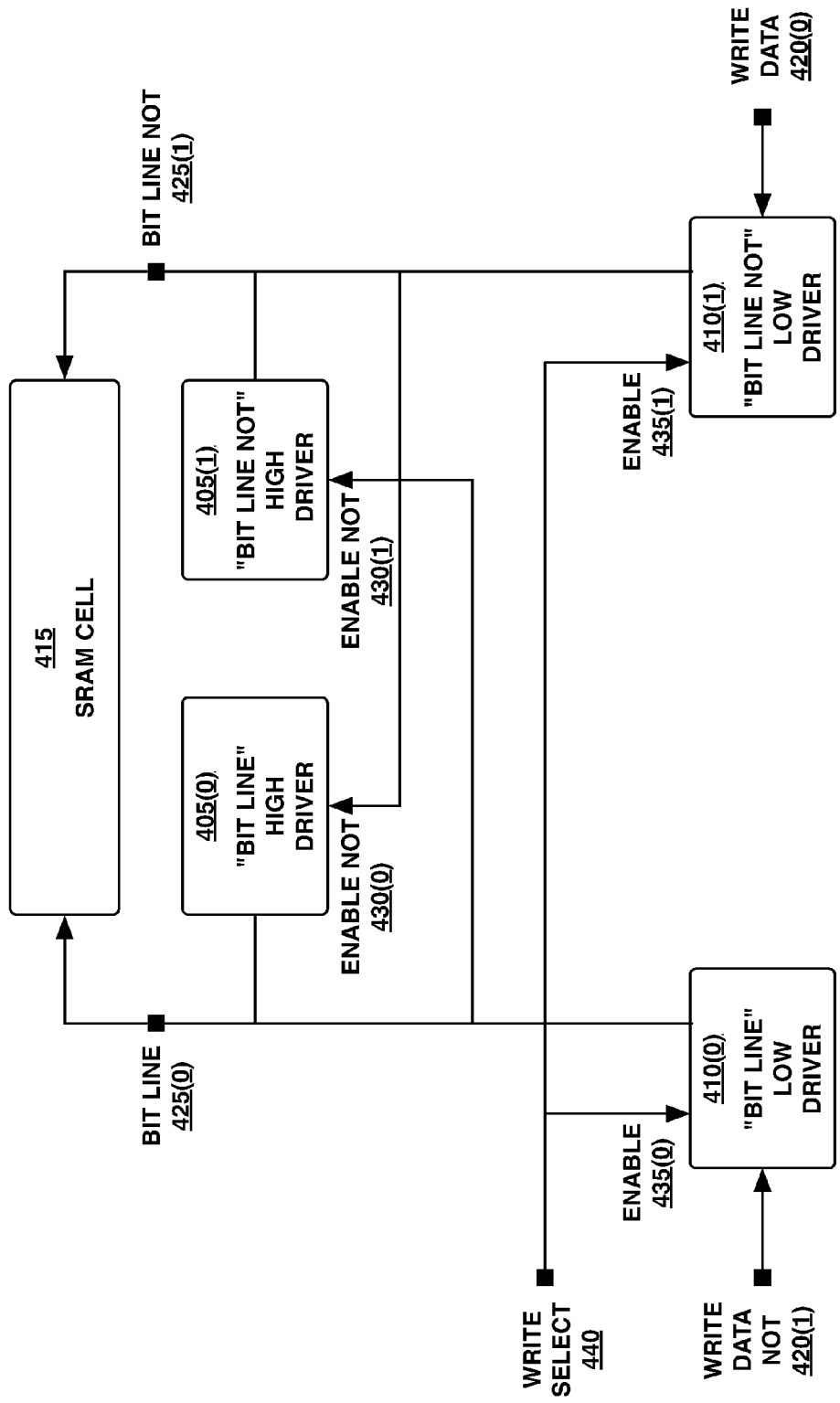
FIG. 4 is a conceptual diagram of a subsystem configured to write data to an SRAM memory cell with elevated write failure immunity, according to one embodiment of the present invention.

FIG. 4 is a conceptual diagram of a subsystem 445 configured to write data to an SRAM memory cell with elevated write failure immunity, according to one embodiment of the present invention. Subsystem 445 may be included within any portion of computer system 100 of FIG. 1. For example, PP memory 204 could be implemented in SRAM using the subsystem of FIG. 4. As another example, L1.5 cache 335 could be implemented in SRAM using the subsystem of FIG. 4. In yet another example, memory in system on chip (SoC) applications could be constructed using SRAM.

As shown, subsystem 445 includes "bit line" high driver 405(0), and "bit line" low driver 410(0), "bit line not" high driver 405(1), and "bit line not" low driver 410(1). Further, subsystem 445 writes data to SRAM cell 415. "Bit line" high driver 405(0) and "bit line not" high driver 405(1) produce a high level only when the enable not 430 inputs are low and are open circuit otherwise. "Bit line" low driver 410(0) and "bit line not" low drivers 410(1) produce a low level only when the write data not 420(1) input and write data 420(0), respectively, and the enable inputs 435 are both high, and are open circuit otherwise.

In operation, when write select 440 is high, write select 440 enables "bit line" low driver 410(0) and "bit line not" low driver 410(1). When write data 420(0) is high, write data not 420(1) is, consequently, low, and the output of "bit line" low driver 410(0) is open circuit. Further, when write data 420(0) is high, "bit line not" low driver 410(1) pulls bit line not 425(1) to ground. Further, "bit line not" low driver 410(1) pulls enable not 430(0) to ground, which enables "bit line" high driver 405(0) and keeps a high level at bit line 425(0). Thus, when write select 440 is high, that is, enabled, and write data 420(0) is high, the memory subsystem writes a high level to bit line 425(0) and a low level to bit line not 425(1) of SRAM cell 415.

When write select 440 goes low, write select 440 disables "bit line" low driver 410(0) and "bit line not" low driver 410(1). The outputs of "bit line" low driver 410(0) and "bit line not" low driver 410(1) are, consequently, open circuit, leaving the state of bit line 425(0) and bit line not 425(1) unchanged.

When write select 440 returns high, write select 440, again, enables "bit line" low driver 410(0) and "bit line not" low driver 410(1). When write data 420(0) is low, write data not 420(1) is, consequently, high, and the output of "bit line not" low driver 410(1) is open circuit. Further, when write data not 420(1) is high, "bit line" low driver 410(0) pulls bit line to ground. Further, "bit line" low driver 410(0) pulls enable not 430(1) to ground. "Bit line" low driver 410(0), therefore, enables "bit line not" high driver 405(1) and keeps a high level at bit line not 425(1). Thus, when write select 440 is high, that is, enabled, and write data 420(0) is low, the memory subsystem writes a high level to bit line not 425(1) and a low level to bit line 425(0) of SRAM cell 415. The ability of "bit line" low driver 410(0) and "bit line not" low driver 410(1) to pull to ground effectively is a crucial to the operability of the write subsystem.

Figure 5:
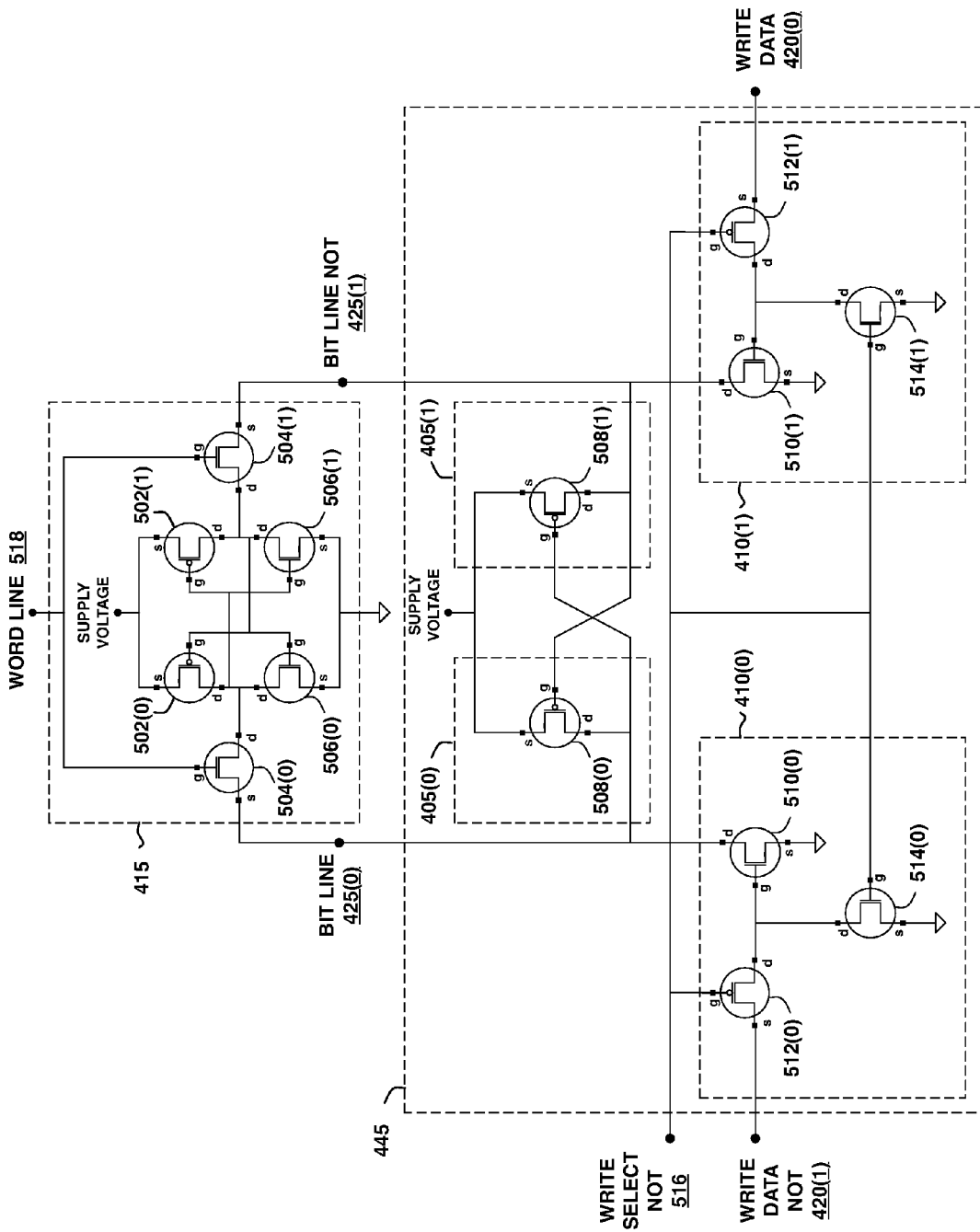
FIG. 5 is a conceptual diagram of an SRAM cell and write drive circuit that implements the subsystem shown in FIG. 4, according to one embodiment of the present invention.

With the design shown in FIG. 4, a single shunt topology, as described below, replaces the conventional dual shunt arrangement to implement both the data writing and column selection. In this manner, "bit line" low driver 410(0) affords stronger drive to bit line 425(0) when compared to conventional topology that cascades two shunt devices to control data and column FIG. 5 is a conceptual diagram of a digital SRAM cell 415 and write drive circuit 445 that implement the subsystem shown in FIG. 4, according to one embodiment of the present invention. As shown, SRAM write circuit 415 and drive circuits 405 and 410 may be constructed with multiple FETs. More specifically, PFETs, such as PFET 502, establish a conductive channel from source to drain when the voltage on the gate terminal is below a negative threshold voltage, with respect to the source terminal, and is nonconductive otherwise. NFETs, such as NFET 508, establish a conductive channel from source to drain when the voltage on the gate terminal is above a positive threshold voltage, with respect to the source terminal, and is nonconductive otherwise.

As shown, SRAM 415 includes PFETs 502 and NFETs 504 and 506. Further, "bit line" high driver 405(0) includes PFET 508(0), and "bit line not" high driver 405(1) includes PFET 508(1). "Bit line" high driver 405(0) and "bit line not" high driver 405(1) precharge bit line 425(0) and bit line not 425(1), respectively, to keep a high level prior to the write operation. Accordingly, "bit line" high driver 405(0) and "bit line not" high driver 405(1) may be referred to as "bit line" keeper 405(0) and "bit line not" keeper 405(1), respectively. Finally, "bit line" low driver 410(0) includes PFET 512(0) and NFETS 510(0) and 514(0), and "bit line not" low driver 410(1) includes PFET 512(1) and NFETS 510(1) and 514(1).

In operation, SRAM 415 retains data that write drive circuit 520 stores. In SRAM 415, the output of one inverter, formed by CMOS pair 502(0) and 506(0), is connected to the input of a second inverter formed by CMOS pair 502(1) and 506(1). Further, the output of the inverter formed by CMOS pair 502(1) and 506(1) is connected to the input of the inverter formed by CMOS pair 502(0) and 506(0). When word line 518 is held low, PFETs 504 are non-conducting. Thus, SRAM 415 retains the stable condition of the cross-coupled inverters formed by FETs 502 and 506. When word line 518 is high, write drive circuit 520 may override the state of the data stored in SRAM 415.

When column select not 516 is high, PFETs 512 are non-conducting and NFETs 514 are conducting. NFET 514(0) establishes a conductive path between the gate of NFET 510(0) and ground; NFET 510(0) is, thus, non-conducting. NFET 514(1) establishes a conductive path between the gate of NFET 510(1) and ground; NFET 510(1) is, thus, non-conducting. Consequently, the state of write data 420(0) and 420(1) does not impact the state of the data stored in SRAM 415. When column select not 516 is low, PFETs 512 are conducting, and NFETs 514 are non-conducting. Thus, PFET 512(0) connects write data not 420(1) to the gate terminal of NFET 510(0), and PFET 512(1) connects write data 420(0) to the gate terminal of NFET 510(1).

Subsequently, when write data 420(0) goes high, NFET 510(1) conducts, and pulls bit line not 425(1) to ground. Further, NFET 510(1) pulls the gate of PFET 508(0) to ground, which drives PFET 508(0) to the conducting state. Thus, PFET 508(0) keeps bit line 425(0) at a high level while NFET 510(1)) overrides the high level in bit line not 425(1).

Conversely, when write data not 420(1) goes high, NFET 510(0) conducts, and pulls bit line 425(0) to ground. Further, NFET 510(0) pulls the gate of PFET 508(1) to ground, which drives PFET 508(1) to the conducting state. Thus, PFET 508(1) keeps bit line not 425(1) at a high level while NFET 510(0)) overrides the high level in bit line 425(0).

Matrix array control of write drive circuit 520 is implemented via write select not 516 controlling series PFETs 512 and write data 420(0) controlling single NFET 510(1) to ground and write data not 420(1) controlling single NFET 510(0) to ground. The single NFET 510 provides a stronger drive capability than conventional drivers, thus ensuring more effective write performance.

With the design shown in FIG. 5, a single shunt topology replaces the conventional dual shunt arrangement to implement both the data writing and column selection. Data input write data not 420(1) controls the single NFET 510(0) to pull bit line 425(0) to ground, while series PFET 512(0) controls column selection. Thus, when inactive, write select not 516 gates write data not 420(1) to prevent access. In this manner, NFET 510(0) affords stronger drive to bit line 425(0) when compared to conventional topology that cascades two shunt NFETs to control data and column. The pass transistor, PFET 512(0), and the transistor capable of temporarily grounding the gate of NFET 510(0) when activated, NFET 514(0), are substantially smaller than the single N-channel MOS device, NFET 510(0), in the drive path. Further, the single N-channel MOS device, NFET 510(0), in the drive path is smaller than any of the series NFETs used in conventional drivers with the same drive strength.

Figure 6:
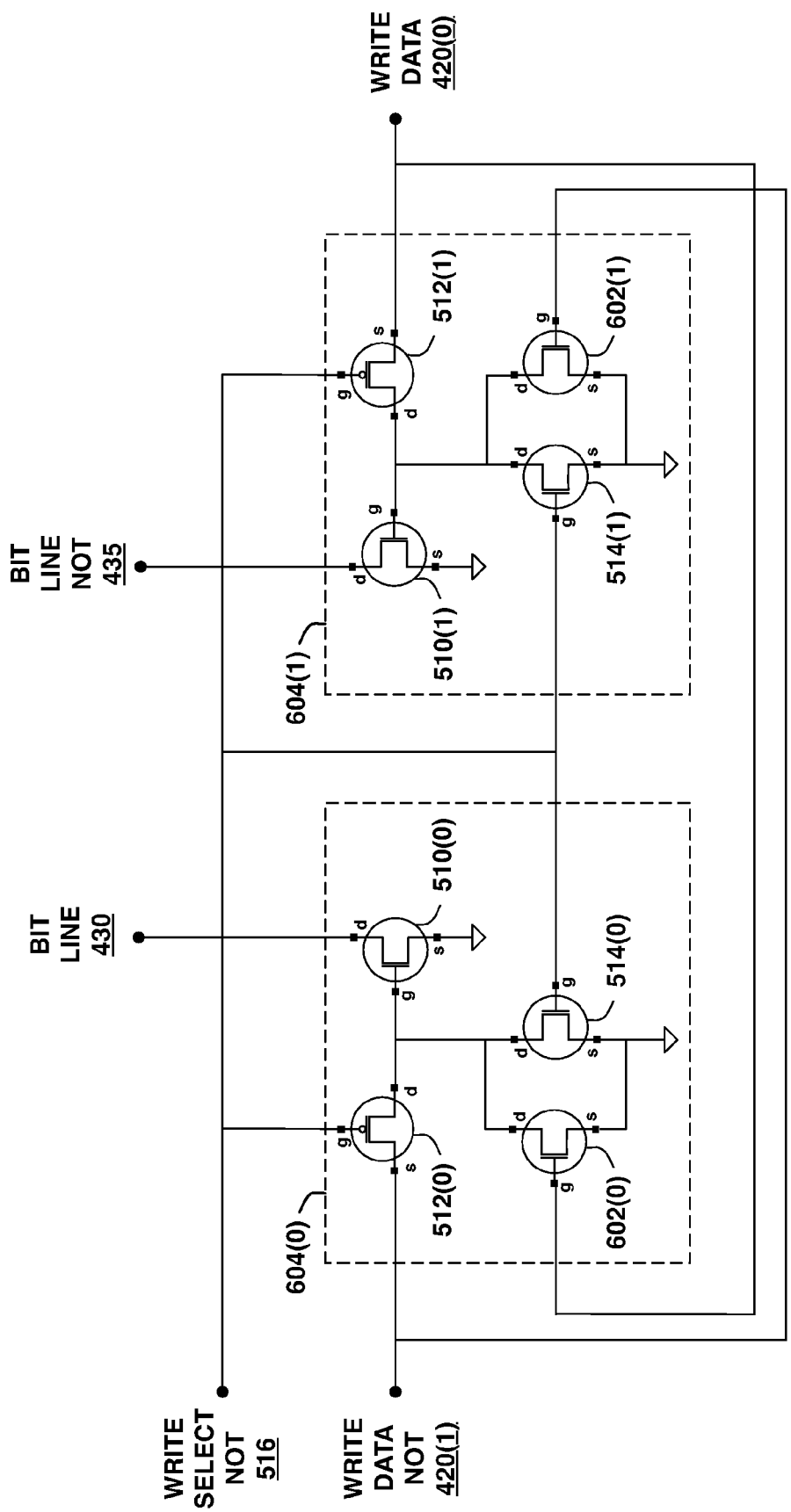
FIG. 6 is a conceptual diagram of a digital control circuit configured to ensure turn-off of the non-driving leg of an SRAM memory cell driver, according to one embodiment of the present invention.

FIG. 6 is a conceptual diagram of a digital control circuit 604 configured to ensure turn-off of the non-driving leg of an SRAM memory cell driver, according to one embodiment of the present invention. Control circuit 604 provides an improvement in the functionality of "bit line" low driver 410(0) and "bit line not" low driver 410(1), as described in greater detail below. As shown, control circuit 604(0) includes PFET 512(0), NFETs 510(0) and 514(0), and additional NFET 602(0). Further, control circuit 604(1) includes PFET 512(1), NFETs 510(1) and 514(1), and additional NFET 602(1).

In operation, when write select not 516 is low, that is, enabled, NFET 514(0) is non-conducting and PFET 512(0) is conducting. When write data not 420(1), then, transitions low, there is no positive gate drive to NFET 510(0). NFET 510(0) is, consequently, non-conducting. However, PFET 512(0) may provide a weak conductive path from the gate of NFET 510(0) to ground. As a result, NFET 510(0) may be vulnerable to anomalous or partial turn on due to, for example, noise or leakage effects. If noise or leakage or other anomalous effects were to raise the voltage of the gate of NFET 510(0) above the threshold voltage of NFET 510(0), NFET 510(0) may begin to conduct, thus creating a potential write error and power consumption.

This potential error scenario is eliminated by the inclusion of NFET 602(0). When write data not 420(1) is low, write data 420(0) is high and drives NFET 602(0). NFET 602(0) provides a strong, deterministic conductive path between the gate of NFET 510(0) and ground, thus promoting reliable turn off under many circumstances.

Similarly, when write select not 516 is low, that is, enabled, NFET 514(1) is non-conducting and PFET 512(1) is conducting. When write data 420(0), then, transitions low, there is no positive gate drive to NFET 510(1). NFET 510(1) is, consequently, non-conducting. However, PFET 512(1) may provide a weak path from the gate of NFET 510(1) to ground. As a result, NFET 510(1) may be vulnerable to anomalous or partial turn on due to, for example, noise or leakage effects. If noise or leakage or other anomalous effects were to raise the voltage of the gate of NFET 510(1) above the threshold voltage of NFET 510(1), NFET 510(1) may begin to conduct, thus creating a potential write error.

This potential error scenario is eliminated by the inclusion of NFET 602(1). When write data 420(0) is low, write data not 420(1) is high and drives NFET 602(1). NFET 602(1) provides a strong, deterministic conductive path between the gate of NFET 510(1) and ground, thus ensuring reliable turn off under all circumstances. Thus, the inclusion of NFETs 602 provide a significant improvement to the reliable operation of the write drive circuit.

Figure 7:
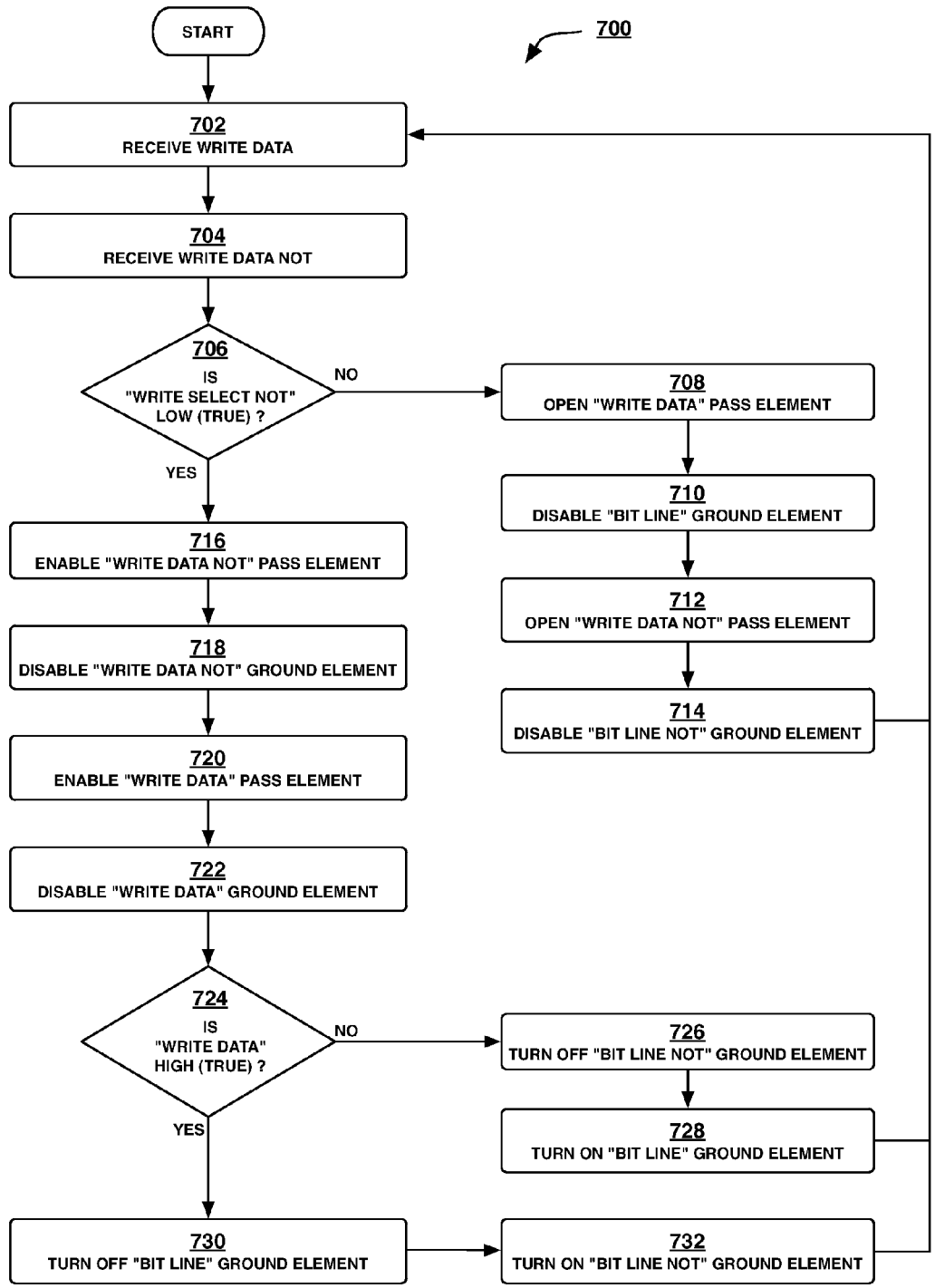
FIG. 7 is a flow diagram of method steps for performing a write operation with elevated failure immunity, according to one embodiment of the present invention.

FIG. 7 is a flow diagram of method steps for performing a write operation with elevated failure immunity, according to one embodiment of the present invention. Although the method steps are described in conjunction with the systems of FIGS. 1-6, persons skilled in the art will understand that any system configured to perform the method steps, in any order, is within the scope of the present invention.

As shown, a method 700 begins at step 702, where "bit line not" low driver 410(1) receives write data 420(0). The method 700 then proceeds to step 704. At step 704, "bit line" low driver 410(0) receives write data not 420(1), the complement of write data. The method 700 then proceeds to step 706. At step 706, "bit line" low driver 410(0) determines if write select not 516 is low, that is, true. If, at step 706, "bit line" low driver 410(0) determines if write select not 516 is high, that is, not true, the method 700 then proceeds to step 708.

At step 708, "bit line" low driver 410(0) opens pass element 512(0). The method 700 then proceeds to step 708. The method 700 then proceeds to step 710. At step 710, "bit line" low driver 410(0) disables bit line 425(0) ground element 510(0) by turning on NFET 514(0) to ground the gate of bit line 425(0) ground element 510(0). The method 700 then proceeds to step 712. At step 712, "bit line not" low driver 410(1) opens pass element 512(1). The method 700 then proceeds to step 714. At step 714, "bit line not" low driver 410(1) disables bit line not 425(1) ground element 510(1) by turning on NFET 514(1) to ground the gate of bit line not 425(1) ground element 510(1). Thus, write select not 516 being in the high state inhibits the write operation. The method 700 then returns to step 702 to further receive write data 420(0).

Returning, now, to step 706, if "bit line" low driver 410(0) determines if write select not 516 is low, that is, true, the method 700 then proceeds to step 716. At step 716, "bit line" low driver 410(0) enables pass element 512(0). The method 700 then proceeds to step 718. At step 718, "bit line" low driver 410(0) enables write data not 425(0) ground element 510(0) by turning off NFET 514(0) to enable the gate of write data not 425(0) ground element 510(0). The method 700 then proceeds to step 720. At step 720, "bit line not" low driver 410(1) enables pass element 512(1). The method 700 then proceeds to step 722. At step 722, "bit line not" low driver 410(1) enables write data not 425(1) ground element 510(1) by turning off NFET 514(1) to enable the gate of write data not 425(1) ground element 510(1). The method 700 then proceeds to step 724.

At step 724, "bit line not" low driver 410(1) determines if write data 420(0) is high, that is, true. If, at step 724, "bit line not" low driver 410(1) determines that write data 420(0) is not high, the method 700 then proceeds to step 726. At step 726, write data 420(0) turns off bit line not 425(1) ground element 510(1) via pass element 512(1). The method 700 then proceeds to step 728. At step 728, write data not 420(1) turns on bit line 425(0) ground element 510(0) via pass element 512(0). The method 700 then returns to step 702 to further receive write data 420(0).

Returning, now, to step 724, if "bit line not" low driver 410(1) determines that write data 420(0) is high, the method 700 then proceeds to step 730. At step 730, write data not 420(1) turns off bit line 425(0) ground element 510(0) via pass element 512(0). The method 700 then proceeds to step 732. At step 732, write data 420(0) turns on bit line not 425(1) ground element 510(1) via pass element 512(1). The method 700 then returns to step 702 to further receive write data 420(0).

In sum, a subsystem configured to write data to a static random access memory cell employs a single N-channel MOS device connected to ground in each leg of the bi-stable memory cell to overdrive the stored data. The subsystem implements the dual control required to effect matrix operation of the SRAM cell in the gate circuit of the single N-channel MOS device in the drive path. Specifically, the column select signal controls a semiconductor junction that interrupts the data connection to the gate. In this manner, the column select control is removed from the drive path, thus increasing drive strength. Further, a second semiconductor junction connects the gate of the single NMOS device in the drive path when the gate signal is interrupted.

One advantage of the subsystems disclosed herein is that the circuit topology increases the drive strength of the SRAM write circuit and reduces die area. The pass transistor and the transistor capable of temporarily grounding the gate of the drive transistor are substantially smaller than the single N-channel MOS device in the drive path. Further, the single N-channel MOS device in the drive path is smaller than a single one of the series NFETs used in conventional drivers. In this manner, the subsystem improves the drive capability of the single N-channel MOS device in the drive path. Further, the improved drive strength of the write circuit permits operation at reduced supply voltages, thus supporting the trend to lower voltage SRAM circuits in the present technology.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

The invention claimed is:

1. A subsystem, comprising:
a first bit line driver that drives a single bit line of a memory cell, writes a data bit to the memory cell, and includes:
a first field effect transistor (FET) that includes:
a first FET gate terminal that receives a first write select line as an input,
a first FET first data terminal that transmits a first data line that transports the data bit, and
a first FET second data terminal directly coupled to the first data line;
a second FET that includes:
a second FET pate terminal that receives the first write select line as an input, and
a second FET data terminal that is directly coupled to the first FET first data terminal; and
a first circuit element that includes:
a first input terminal directly coupled to the first FET first data terminal and the second FET data terminal, and
a first circuit data terminal that is directly coupled to the single bit line of the memory cell.

2. The subsystem of claim 1, wherein the first FET comprises a P-channel field effect transistor, and the second FET and the first circuit element comprise N-channel field effect transistors.

3. The subsystem of claim 1, further comprising:
a second bit line driver that writes the inverse of the data bit to the memory cell and including:
a third FET that includes: is
a third FET gate terminal that receives the first write select line as an input, and
a third FET data terminal that transmits a second data line that transports the inverse of the data bit,
a fourth FET that includes:
a fourth FET gate terminal that receives the first write select line as an input, and
a fourth FET data terminal that is coupled to the third FET data terminal; and
a second circuit element coupled to the memory cell, wherein the second circuit element includes a second input terminal directly coupled to the third FET terminal and the fourth FET terminal.

4. The subsystem of claim 3, wherein the third FET comprises a P-channel field effect transistor, and the fourth FET and the second circuit element comprise N-channel field effect transistors.

5. The subsystem of claim 3, wherein the first bit line driver further includes a third circuit element that is directly coupled to the first circuit element and includes a third input terminal that receives the second data line as an input.

6. The subsystem of claim 5, wherein, in response to the second write data line being activated, the seventh-third circuit element pulls the first input terminal to ground.

7. The subsystem of claim 6, wherein the third element comprises an N-channel field effect transistor.

8. The subsystem of claim 3, wherein the second bit line driver further includes a fourth circuit element that is directly coupled to the second circuit element and includes a fourth input terminal that receives the first data line as an input.

9. The subsystem of claim 8, wherein, in response to the first write data line being activated, the fourth circuit element pulls the second input terminal to ground.

10. The subsystem of claim 9, wherein the fourth circuit element comprises an N-channel field effect transistor.

11. A computer-implemented method for performing write operations with memory cells, the method comprising:
driving, by a first bit line driver, a single bit line of a memory cell by:
causing a first write select line to activate a first field effect transistor (FET) included in the first bit line driver, wherein the first FET includes a first FET gate terminal that receives the first write select line, a first FET first data terminal that outputs a data bit that is transported by a first data line, and a first FET second data terminal directly coupled to the first data line; and
causing the first write select line to activate a second FET included in the first bit line driver, wherein the second FET includes a second FET gate terminal that receives the first write select line, and a second FET data terminal circuit element that is directly coupled to the first FET first data terminal;

wherein a first circuit element included in the first bit line driver includes a first input terminal directly coupled to the first FET first data terminal and the second FET data terminal and a first circuit data terminal that is directly coupled to the single bit line of the memory cell; and writing, by the first bit line driver, the data bit to the memory cell.

12. The computer-implemented method of claim 11, further comprising:

causing the first write select line to activate a third FET included in a second bit line driver, wherein the third FET includes a third FET gate terminal that receives the first write select line, and a third FET data terminal that outputs the inverse of the data bit that is transported by a second data line; and causing the first write select line to activate a a fourth FET included in a second bit line driver, wherein the fourth FET includes a fourth FET gate terminal that receives the first write select line, and a fourth FET data terminal that is coupled to the third FET data terminal:

wherein a second circuit element included in the second bit line driver includes a second input terminal directly coupled to the third FET data terminal and the fourth FET data terminal.

13. The computer-implemented method of claim 12, further comprising causing a third circuit element to pull the first input terminal to ground in response to activation of the second data line.

14. The computer-implemented method of claim 12, further comprising causing a fourth circuit element to pull second input terminal to ground in response to activation of the first data line.

15. A system, comprising:

a memory cell; and a first bit line driver that drives a single bit line of the memory cell, writes a data bit to the memory cell, and includes:

a first field effect transistor (FET) that includes:
a first FET gate terminal that receives a first write select line as an input,
a first FET first data terminal that transmits a first data line that transports the data bit, and
a first FET second data terminal directly coupled to the first data line;

a second FET that includes:
a second FET gate terminal that receives the first write select line as an input, and
a second FET data terminal that is directly coupled to the first FET first data terminal: and a first circuit element that is coupled to the memory cell, wherein the first circuit element includes:

a first input terminal directly coupled to the first FET first data terminal and the second FET data terminal, and a first circuit data terminal that is directly coupled to the single bit line of the memory cell.

16. The system of claim 15, further comprising:

a second bit line driver coupled to the memory cell and including:

a third FET that includes:
a third FET gate terminal that receives the first write select line as an input, and
a third FET data terminal that transmits a second data line that transports the inverse of the data bit, a fourth FET that includes:
a fourth FET gate terminal that receives the first write select line as an input, and
a fourth FET data terminal that is coupled to the third FET data terminal: and a second circuit element coupled to the memory cell, wherein the second circuit element includes a second input terminal directly coupled to the third FET terminal and the fourth FET terminal.

17. The system of claim 16, wherein the first bit line driver further includes a third circuit element that is directly coupled to the third-first circuit element and includes a third input terminal that receives the second data line as an input, wherein the third circuit element pulls the first input terminal to ground in response to the second write data line being activated.

18. The system of claim 17, wherein the first FET comprises a P-channel field effect transistor, and the second FET, the first circuit element, and the third circuit element comprise N-channel field effect transistors.

19. The system of claim 16, wherein the second bit line driver further includes a fourth circuit element that is directly coupled to the second circuit element and includes a fourth input terminal that receives the first data line as an input, wherein the fourth circuit element pulls the second input terminal to ground in response to the first write data line being activated.

20. The system of claim 19, wherein the third FET comprises a P-channel field effect transistor, and the fourth FET, the second circuit element, and the fourth circuit element comprise N-channel field effect transistors.

21. The subsystem of claim 1, wherein each of the first FET and the second FET is substantially smaller than the first circuit element.

22. The subsystem of claim 1, wherein the first circuit element forms a single shunt to pull the bit line to ground.

23. The subsystem of claim 3, wherein the second bit line driver drives a second single bit line of the memory cell.

* * * * *

UNITED STATES PATENT AND TRADEMARK OFFICE
CERTIFICATE OF CORRECTION

PATENT NO.        : 10,249,361 B2
APPLICATION NO.   : 14/154678
DATED             : April 2, 2019
INVENTOR(S)       : Eugene Wang, Gavin Chen and Demi Shen Page 1 of 1

It is certified that error appears in the above-identified patent and that said Letters Patent is hereby corrected as shown below:

In the Claims

Column 13, Claim 1, Line 63, please delete "pate" and insert --gate--;

Column 14, Claim 3, Line 13, please delete "is";

Column 14, Claim 6, Line 36, please delete "seventh-third" and insert --third--;

Column 15, Claim 12, Line 17, please delete "a" after a;

Column 15, Claim 12, Line 21, please delete ":" and insert --;--;

Column 15, Claim 15, Line 50, please delete ":" and insert --;--;

Column 16, Claim 16, Line 18, please delete ":" and insert --;--;

Column 16, Claim 17, Line 25, please delete "third-first" and insert --first--.

Signed and Sealed this
Thirtieth Day of July, 2019

Andrei Iancu
*Director of the United States Patent and Trademark Office*